United States Patent
Kim et al.

(10) Patent No.: US 10,971,654 B2
(45) Date of Patent: Apr. 6, 2021

(54) DISPLAY DEVICE USING SEMICONDUCTOR LIGHT EMITTING DEVICE AND METHOD FOR MANUFACTURING THE SAME

(71) Applicant: LG ELECTRONICS INC., Seoul (KR)

(72) Inventors: Junghoon Kim, Seoul (KR); Changseo Park, Seoul (KR); Bongchu Shim, Seoul (KR); Byoungkwon Cho, Seoul (KR); Hyunwoo Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/894,262

(22) Filed: Jun. 5, 2020

(65) Prior Publication Data
US 2020/0303592 A1    Sep. 24, 2020

Related U.S. Application Data

(63) Continuation of application No. 16/415,583, filed on May 17, 2019, now Pat. No. 10,707,377, which is a
(Continued)

(30) Foreign Application Priority Data

Apr. 19, 2018  (KR) .................. 10-2018-0045721
Sep. 7, 2018   (KR) .................. 10-2018-0107336

(51) Int. Cl.
*H01L 33/38* (2010.01)
*H01L 33/20* (2010.01)
(Continued)

(52) U.S. Cl.
CPC .......... *H01L 33/38* (2013.01); *H01L 25/0753* (2013.01); *H01L 33/0095* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 9,825,202 B2 | 11/2017 | Schuele et al. | |
| 2004/0089932 A1 | 5/2004 | Craig et al. | |
| 2006/0163596 A1* | 7/2006 | Kim ...................... | H05K 1/0203 257/98 |
| 2007/0087472 A1* | 4/2007 | Huber .................... | H01L 24/95 438/106 |

(Continued)

FOREIGN PATENT DOCUMENTS

| | | |
|---|---|---|
| KR | 10-2007-0096212 A | 10/2007 |
| KR | 10-2015-0005628 A | 1/2015 |

(Continued)

*Primary Examiner* — Ratisha Mehta
(74) *Attorney, Agent, or Firm* — Birch, Stewart, Kolasch & Birch, LLP

(57) ABSTRACT

Discussed is a display device, including a semiconductor light emitting device and a substrate having a receiving groove in which the semiconductor light emitting device is accommodated, wherein the semiconductor light emitting device includes a first conductive semiconductor layer, a second conductive semiconductor layer disposed on an upper portion of the first conductive semiconductor layer, a first conductive electrode disposed on the first conductive semiconductor layer and a second conductive electrode disposed on the second conductive semiconductor layer, and spaced apart from the first conductive electrode along a horizontal direction of the semiconductor light emitting device, wherein the first conductive semiconductor layer has a symmetrical shape with respect to at least one direction of the semiconductor light emitting device so that the first conductive electrode and the second conductive electrode are arranged at preset positions when the semiconductor light emitting device is accommodated into the receiving groove.

20 Claims, 13 Drawing Sheets

Related U.S. Application Data continuation of application No. PCT/KR2018/011534, filed on Sep. 28, 2018.

(51) Int. Cl.
  *H01L 33/40*   (2010.01)
  *H01L 33/44*   (2010.01)
  *H01L 25/075*  (2006.01)
  *H01L 33/00*   (2010.01)
  *H01L 33/62*   (2010.01)

(52) U.S. Cl.
  CPC .............. *H01L 33/20* (2013.01); *H01L 33/40* (2013.01); *H01L 33/44* (2013.01); *H01L 33/62* (2013.01); *H01L 2933/0033* (2013.01)

(56) References Cited

U.S. PATENT DOCUMENTS

| | | | |
|---|---|---|---|
| 2007/0164298 A1* | 7/2007 | Kim | H01L 33/0093 257/94 |
| 2017/0148771 A1 | 5/2017 | Cha et al. | |
| 2019/0189876 A1 | 6/2019 | Lee et al. | |

FOREIGN PATENT DOCUMENTS

| | | |
|---|---|---|
| KR | 10-2017-0022755 A | 3/2017 |
| KR | 10-2018-0015940 A | 2/2018 |

\* cited by examiner

DISPLAY DEVICE USING SEMICONDUCTOR LIGHT EMITTING DEVICE AND METHOD FOR MANUFACTURING THE SAME

CROSS-REFERENCE TO RELATED APPLICATIONS

This application is a Continuation of U.S. patent application Ser. No. 16/415,583 filed on May 17, 2019, which is a Continuation of PCT International Application No. PCT/KR2018/011534, filed on Sep. 28, 2018, which claims priority under 35 U.S.C. 119(e) to Korean Patent Application No. 10-2018-0045721, filed on Apr. 19, 2018 and Korean Patent Application No. 10-2018-0107336, filed on Sep. 7, 2018, all of these applications are hereby expressly incorporated by reference into the present application.

BACKGROUND OF THE INVENTION

1. Field of the Invention

The present disclosure relates to a display device and a fabrication method thereof, and more particularly, to a display device using a semiconductor light emitting device.

2. Description of the Related Art

In recent years, liquid crystal displays (LCDs), organic light emitting diode (OLED) displays, and micro LED displays have been competing to implement a large-area display in the field of display technology.

However, there exist problems such as not-so-fast response time, low efficiency of light generated by backlight in case of LCDs, and there exist drawbacks such as short life span, not-so-good yield as well as low efficiency in case of OLEDs.

On the contrary, when semiconductor light emitting devices (micro LED (pLED)) having a diameter or a cross sectional area of 100 microns or less are used in a display, the display can provide a very high efficiency because it does not absorb light using a polarizing plate or the like. However, since a large-sized display requires millions of semiconductor light emitting devices, it has difficulty in transferring the devices compared to other technologies.

Technologies currently in development for transfer processes include pick & place, laser lift-off (LLO), self-assembly, or the like. Among them, the self-assembly method, which is a method in which the semiconductor light emitting device locates themselves in a fluid, is the most advantageous method for realizing a large-sized display device.

In recent years, U.S. Pat. No. 9,825,202 proposed a micro LED structure suitable for self-assembly, but there is not yet research on technologies for fabricating a display through self-assembly of micro LEDs.

In addition, in order to transfer micro LEDs to fabricate a display, electrical connection (i.e. wiring) for applying a current or voltage to each of the micro LEDs can be required, and thus a new type of structure and fabrication method in consideration of the wiring in the self-assembly will be presented.

SUMMARY OF THE INVENTION

An object of the present disclosure is to provide a new fabrication process with high reliability in a large-screen display using micro-sized semiconductor light emitting devices.

Another object of the present disclosure is to provide a fabrication process and structure of a display capable of controlling an assembly direction when semiconductor light emitting devices are self-assembled on a wiring substrate.

A display device according to the present disclosure can have an asymmetrical shape between a receiving groove of a wiring substrate and a semiconductor light emitting device, and an assembly direction can also be ensured while performing self-assembly with a horizontal chip using the asymmetrical shape, thereby simplifying the wiring process subsequent to the assembly.

More specifically, the display device can include a semiconductor light emitting device, and a substrate having a receiving groove in which the semiconductor light emitting device is accommodated, wherein the semiconductor light emitting device includes a first conductive semiconductor layer, a second conductive semiconductor layer disposed at an upper portion of the first conductive semiconductor layer, a first conductive electrode disposed on the first conductive semiconductor layer, and a second conductive electrode disposed on the second conductive semiconductor layer, and spaced apart from the first conductive electrode along a horizontal direction, and when the semiconductor light emitting device is assembled into the receiving groove, the first conductive semiconductor layer has an asymmetrical shape with respect to at least one direction so that the first conductive electrode and the second conductive electrode are arranged at preset positions.

According to an embodiment, the first conductive semiconductor layer can have a symmetrical shape with respect to the other direction perpendicular to the one direction. The first conductive electrode and the second conductive electrode can be arranged in a row along the other direction.

The cross section of the first conductive semiconductor layer can include a circular portion, and a straight portion connecting both ends of the circular portion. The center of the cross section of the first conductive semiconductor layer can be eccentrically formed on one side along the other direction.

According to an embodiment, the receiving groove can be formed in a passivation layer, and the receiving groove can have an asymmetrical shape with respect to the one direction so as to match the shape of the first conductive semiconductor layer.

The first conductive electrode and the second conductive electrode can be connected to a first wiring electrode and a second wiring electrode, respectively, and the first wiring electrode and the second wiring electrode can be extended to one surface of the passivation layer. The substrate can include a plurality of pair electrodes that generate an electric field when an electric current is supplied thereto. The first wiring electrode and the second wiring electrode can be formed on an opposite side to the plurality of the pair electrodes with respect to the semiconductor light emitting devices.

According to an embodiment, at least one of the first conductive electrode and the second conductive electrode can include a magnetic body.

In addition, the present disclosure can disclose a fabrication method of a display device, and the method can include transferring a substrate to an assembly position, and placing semiconductor light emitting devices having a first conductive semiconductor layer and a second conductive semiconductor layer into a fluid chamber, guiding the movement of the semiconductor light emitting devices in the fluid chamber to assemble the semiconductor light emitting devices into receiving grooves of the substrate, and connecting a first wiring electrode and a second wiring electrode to the plurality of semiconductor light emitting devices, wherein at least one of the plurality of conductive semiconductor layers of the plurality of semiconductor light emitting devices has an asymmetrical shape with respect to one direction so that the conductive electrodes of the semiconductor light emitting devices are arranged at preset positions when the semiconductor light emitting devices are assembled into the receiving grooves.

According to an embodiment, said assembly process can include applying a magnetic field to the semiconductor light emitting devices to move the semiconductor light emitting devices along a magnetic force in the fluid chamber, and guiding the semiconductor light emitting devices to the receiving grooves of the substrate by applying an electric field so that the semiconductor light emitting devices are placed at the receiving grooves during the movement of the semiconductor light emitting devices.

According to the present disclosure having the foregoing configuration, a large number of semiconductor light emitting devices can be assembled at one time in a display device in which individual pixels are formed with micro light emitting diodes. In addition, according to the present disclosure, an assembly direction of a horizontal semiconductor light emitting device can be ensured by performing self-assembly using the asymmetrical shape between a receiving groove and a semiconductor light emitting device, thereby having an advantage capable of simplifying the wiring process subsequent to the assembly.

As described above, according to the present disclosure, a large number of semiconductor light emitting devices can be pixelated on a wafer having a small size, and then directly transferred onto a large-area substrate. Furthermore, as the wiring of the semiconductor light emitting devices is carried out on a substrate, it is possible to directly transfer the semiconductor light emitting devices to a wiring substrate without using a temporary substrate. Through this, it can be possible to fabricate a large-area display device at a low cost.

In addition, according to the fabrication method and device of the present disclosure, semiconductor light emitting devices can be simultaneously transferred to exact positions using a magnetic field and an electric field in a solution, thereby allowing a low cost, high efficiency, and high-speed transfer implementation.

In addition, since assembly by an electric field is carried out, selective assembly is allowed through a selective electrical application without any additional device or process. Accordingly, red, green, and blue micro LEDs can be selectively assembled at desired positions.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
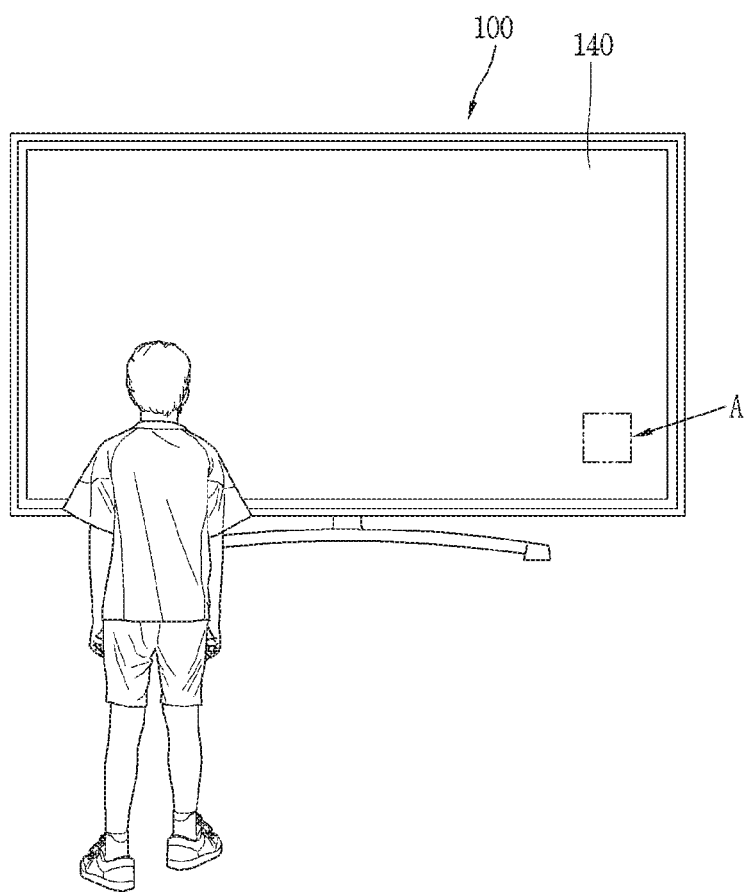
FIG. 1 is a view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element can also be interposed therebetween.

A display device disclosed herein can include a portable phone, a smart phone, a laptop computer, a digital broadcast terminal, a personal digital assistant (PDA), a portable multimedia player (PMP), a navigation, a slate PC, a tablet PC, an ultrabook, a digital TV, a digital signage, a head-mounted display (HMD), a desktop computer, and the like. However, it would be easily understood by those skilled in the art that a configuration disclosed herein can be applicable to any displayable device even though it is a new product type which will be developed later.

Figure 2:
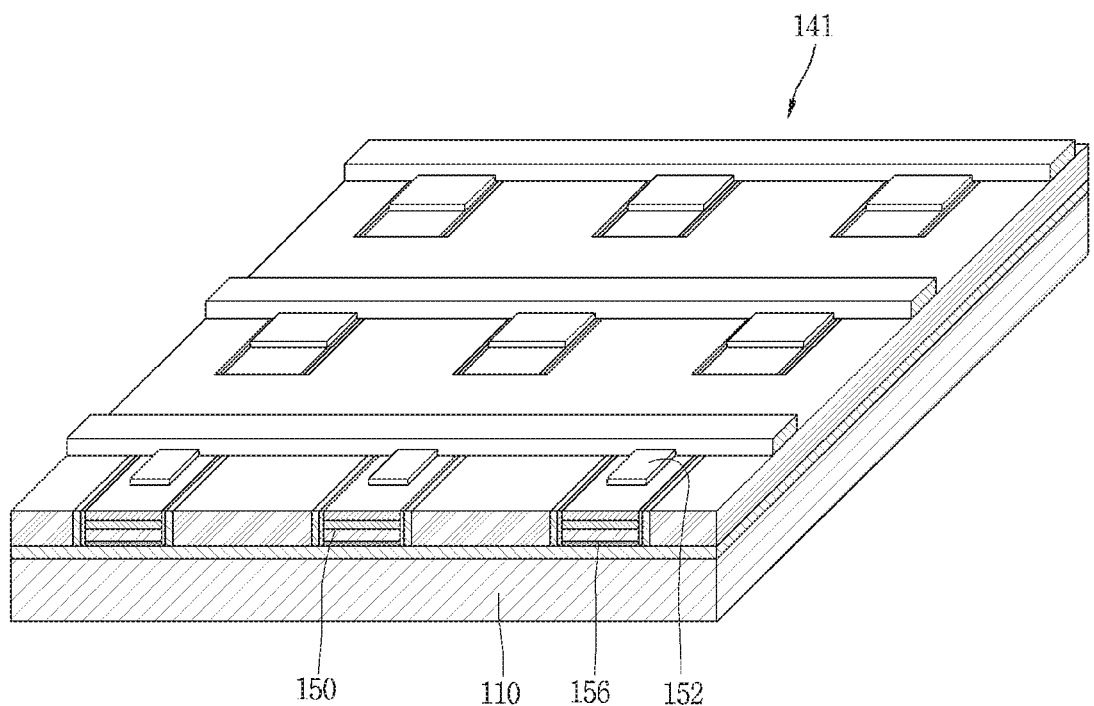
FIG. 2 is a partially enlarged view showing a portion "A" of the display device in FIG. 1.
Figure 3:
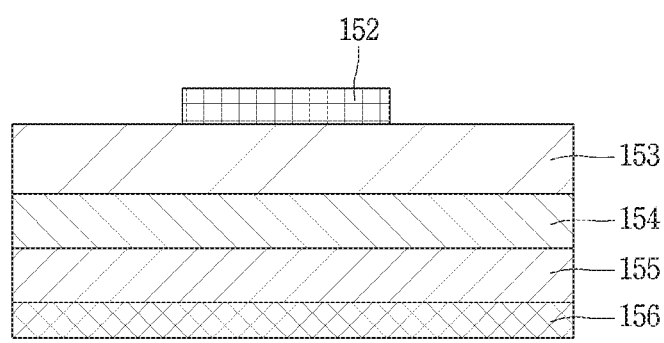
FIG. 3 is an enlarged view showing a semiconductor light emitting device in FIG. 2.
Figure 4A:
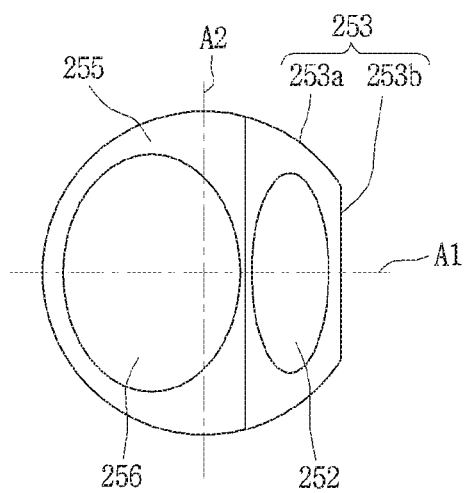
FIGS. 4A and 4B are a plan view and a cross-sectional view showing another embodiment of the semiconductor light in FIG. 2.
Figure 4B:
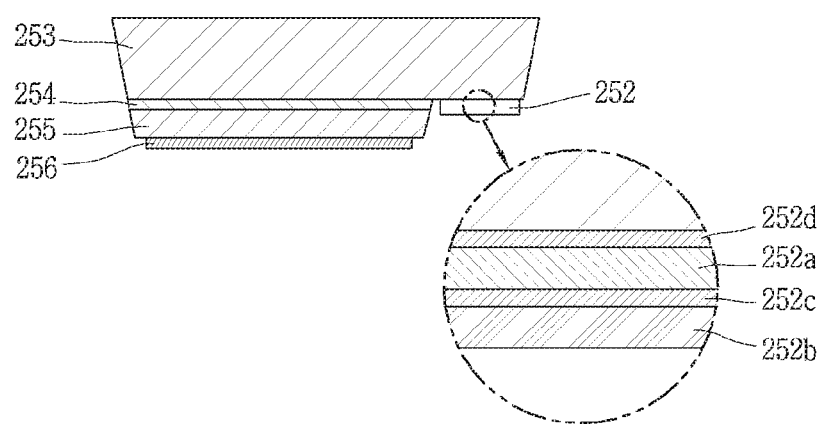

FIG. 1 is a view illustrating a display device using a semiconductor light emitting device according to an embodiment of the present disclosure, and FIG. 2 is a partially enlarged view showing a portion "A" of the display device in FIG. 1, and FIG. 3 is an enlarged view showing a semiconductor light emitting device in FIG. 2, and FIGS. 4A and 4B are a plan view and a cross-sectional view showing another embodiment of the semiconductor light in FIG. 2.

According to the illustration, information processed in the controller of the display device 100 can be displayed on a display module 140. A case 101 in the form of a closed loop surrounding an edge of the display module can form a bezel of the display device.

The display module 140 can include a panel 141 on which an image is displayed, and the panel 141 can include micro-sized semiconductor light emitting devices 150 and a wiring substrate 110 on which the semiconductor light emitting devices 150 are mounted.

Wiring lines can be formed on the wiring substrate 110, and connected to an n-type electrode 152 and a p-type electrode 156 of the semiconductor light emitting device 150. Through this, the semiconductor light emitting device 150 can be provided on the wiring substrate 110 as a self-emitting individual pixel.

An image displayed on the panel 141 is visual information, and implemented by independently controlling the light emission of a sub-pixel arranged in a matrix form through the wiring lines.

According to the present invention, a micro LED (Light Emitting Diode) is illustrated as one type of the semiconductor light emitting device 150 that converts current into light. The micro LED can be a light emitting diode formed with a small size of 100 microns or less. The semiconductor light emitting device 150 can be provided in blue, red, and green light emitting regions, respectively, to implement a sub-pixel by a combination of the light emitting regions. In other words, the sub-pixel denotes a minimum unit for implementing a single color, and at least three micro LEDs can be provided in the sub-pixel.

More specifically, referring to FIG. 3, the semiconductor light emitting device 150 can be a vertical structure.

For example, the semiconductor light emitting devices 150 can be implemented with a high-power light emitting device that emits various lights including blue in which gallium nitride (GaN) is mostly used, and indium (In) and or aluminum (Al) are added thereto.

The vertical semiconductor light emitting device can include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 located at the bottom can be electrically connected to a p-electrode of the wiring substrate, and the n-type electrode 152 located at the top can be electrically connected to an n-electrode at an upper side of the semiconductor light emitting device. The electrodes can be disposed in the upward/downward direction in the vertical semiconductor light emitting device 150, thereby providing a great advantage capable of reducing the chip size.

For another example, referring to FIGS. 4A and 4B, the semiconductor light emitting device can be a flip chip type semiconductor light emitting device.

For such an example, the semiconductor light emitting device 250 can include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 disposed to be separated from the p-type electrode 256 in the horizontal direction on the n-type semiconductor layer 253. In this case, both the p-type electrode 256 and the n-type electrode 252 can be electrically connected to the p-electrode and the n-electrode of the wiring substrate at the bottom of the semiconductor light emitting device.

Here, the n-type semiconductor layer 253 and the n-type electrode 252 can be defined as a first conductive semiconductor layer and a first conductive electrode, and the p-type electrode 256 and the p-type semiconductor layer 255 can be defined as a second conductive electrode and a second conductive semiconductor layer. However, the present disclosure is not necessarily limited thereto, and the n-type can be defined as a second conductive type, and the p-type can be defined as a first conductive type.

The vertical semiconductor light emitting device and the horizontal semiconductor light emitting device can be a green semiconductor light emitting device, a blue semiconductor light emitting device, or a red semiconductor light emitting device, respectively. The green semiconductor light emitting device and the blue semiconductor light emitting device can be mostly formed of gallium nitride (GaN), and indium (In) and/or aluminum (Al) can be added thereto to implement a high-power light emitting device that emits green or blue light. For such an example, the semiconductor light emitting device can be a gallium nitride thin-film formed in various layers such as n-Gan, p-Gan, AlGaN, and InGa, and specifically, the p-type semiconductor layer can be p-type GaN, and the n-type semiconductor layer can be N-type GaN. However, in case of the red semiconductor light emitting device, the p-type semiconductor layer can be p-type GaAs and the n-type semiconductor layer can be n-type GaAs.

In addition, a p-electrode side in the p-type semiconductor layer can be p-type GaN doped with Mg, and an n-electrode side in the n-type semiconductor layer can be n-type GaN doped with Si. In this case, the above-described semiconductor light emitting devices can be semiconductor light emitting devices without an active layer.

On the other hand, referring to FIGS. 1 through 4, since the light emitting diode is very small, the display panel can be arranged with self-emitting sub-pixels arranged at fine pitch, thereby implementing a high-quality display device.

In a display device using the semiconductor light emitting device of the present disclosure described above, a semiconductor light emitting device grown on a wafer and formed through mesa and isolation is used as an individual pixel. In this case, the micro-sized semiconductor light emitting device 150 must be transferred to a wafer at a predetermined position on the substrate of the display panel. Pick and place is used for the transfer technology, but the success rate is low and a lot of time is required. For another example, there is a technology of transferring a plurality of devices at one time using a stamp or a roll, but the yield is limited and not suitable for a large screen display. The present disclosure proposes self-assembly using a fluid as a new fabrication method of a display device capable of solving the foregoing problems and a fabrication device using the same.

To this end, hereinafter, a new structure of the flip chip type semiconductor light emitting device will be described.

The semiconductor light emitting device of the present disclosure has a structure of an asymmetric micro LED. Specifically, when the semiconductor light emitting device is assembled into a receiving groove of the wiring substrate, the first conductive semiconductor layer can have an asymmetrical shape such that the first conductive electrode and the second conductive electrode are arranged at preset positions. In addition, the first conductive semiconductor layer can have a symmetrical shape with respect to the other direction perpendicular to the one direction.

For example, the n-type semiconductor layer 253 can have an asymmetric shape and the p-type semiconductor layer 255 can have a symmetrical shape. Specifically, the cross section of the n-type semiconductor layer 253 can have a circular portion 253a and a straight portion (or a chord) 253b. The n-type semiconductor layer 253 can have a cylindrical shape in which part of the side surface is cut, and can have a shape in which the straight portion 253b connects or transects both ends of the circular portion 253a when viewed from above. On the other hand, the p-type semiconductor layer 255 can have a structure in which the straight portion is disposed further inside. For another example, the p-type semiconductor layer 255 can have a circular or elliptical cross section.

In this case, the other direction can be a direction along a central axis (A1) perpendicular to the center of the straight portion 253b, and the one direction can be a direction in parallel to the straight portion 253b passing through the center of the circle. At this time, the first conductive electrode and the second conductive electrode are arranged in a row along the other direction. Specifically, the first conductive electrode and the second conductive electrode can be arranged in a row along a direction perpendicular to the straight portion 253b.

The shape of the receiving groove 290 of the wiring substrate 261 can be set so as to match the shape of the n-type semiconductor layer 253 since a portion having the largest area in the semiconductor light emitting device is the n-type semiconductor layer 253. Therefore, the receiving groove 290 of the wiring substrate 261 can include a circular portion 290a and a straight portion 290b (refer to FIG. 6), and both ends of the circular portion 290a is connected to the straight portion 290b.

According to such a structure of the semiconductor light emitting device, when the semiconductor light emitting device is assembled into the receiving groove 290, a relative position between the first conductive electrode and the second conductive electrode can be always constant. Therefore, the straight portion of the semiconductor light emitting device can be an assembly guide.

At least one of the first conductive electrode and the second conductive electrode can include a magnetic body. Using such a magnetic body, a magnetic force can be used in the self-assembly which will be described later.

For a specific example, the n-type electrode 252 can include the magnetic body. However, the present disclosure is not limited thereto, and the p-type electrode 256 can also include the magnetic substance. Here, the magnetic body can refer to a metal having magnetism. The magnetic body can be Ni, SmCo or the like, and for another example, a material corresponding to at least one of Gd-based, La-based, and Mn-based materials.

The magnetic body can be provided in the n-type electrode 252 in the form of particles. Furthermore, alternatively, for a conductive electrode including a magnetic body, a single layer of the conductive electrode can be made of a magnetic body. For an example of this, as illustrated in FIG. 9, the n-type electrode 252 of the semiconductor light emitting device can include a first layer 252a and a second layer 252b. Here, the first layer 252a can be made to include a magnetic material, and the second layer 252b can include a metal material other than the magnetic material. In this case, a buffer metal 252c can be disposed between the first layer 252a and the second layer 252b for coupling of different metal materials.

Furthermore, in the present example, another buffer metal 252d can be disposed between the first layer 252a including the magnetic body and the n-type semiconductor layer 253. However, the present disclosure is not necessarily limited thereto, and for another example, the first layer 252a can be disposed so as to be in contact with the n-type semiconductor layer 253 without the buffer metal 252d.

In this case, the first layer 252a is disposed between the second layer 252b and the second conductive semiconductor layer 253. The second layer 252b can be a contact metal connected to the second electrode of the wiring substrate. In embodiments, a size of the p-type electrode 256 can be greater than a size of the n-type electrode 252, or vice-versa, but the sizes thereof can also be equal.

Since the semiconductor light emitting device having the above structure is a horizontal type, the n and p wirings can be simultaneously carried out, and thus cost and time can be saved in fabricating the display device. In this case, it can be possible to transfer directly to a display panel other than a donor, thereby maximizing the transfer yield. In the present disclosure, a new fabrication method and fabrication device is presented to exert such effects using the structure of such a semiconductor light emitting device.

Hereinafter, a new fabrication method of the display device will be described. FIGS. 5A through 5E are views for explaining a new process of fabricating the foregoing semiconductor light emitting device.

In this specification, a display device using a passive matrix (PM) semiconductor light emitting device is illustrated. However, an example described below can also be applicable to an active matrix (AM) type semiconductor light emitting device. In addition, a method using a horizontal semiconductor light emitting device is illustrated, but it is also applicable to a method of self-assembling a vertical semiconductor light emitting device.

First, according to a manufacturing method, a first conductive semiconductor layer 253, an active layer 254, and a second conductive semiconductor layer 255 are respectively grown on a growth substrate 259.

Figure 5A:
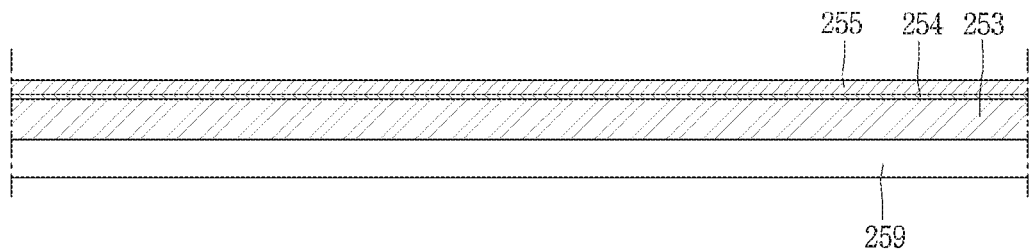
FIGS. 5A through 5E are views for explaining a new process of fabricating the foregoing semiconductor light emitting device.
Figure 5B:
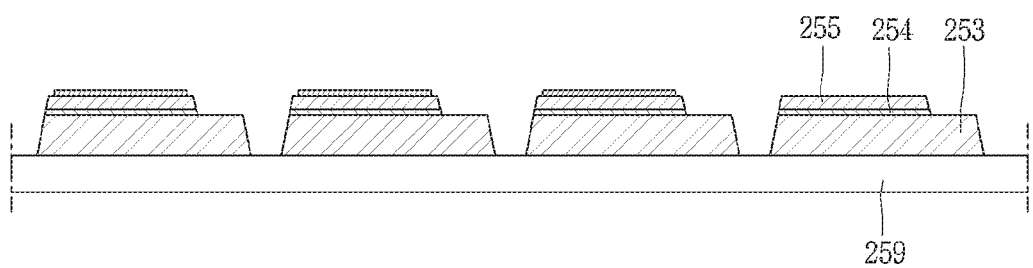
Figure 5C:
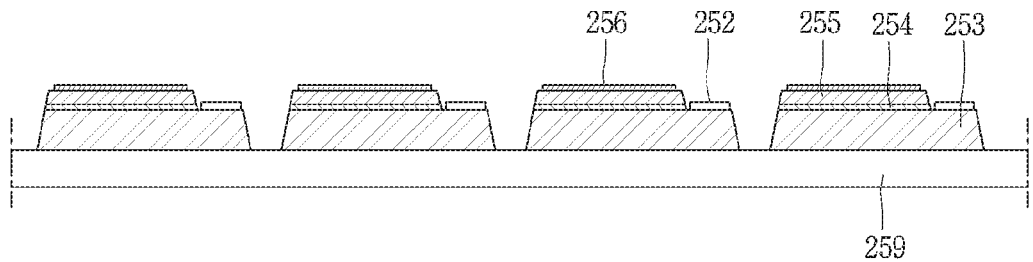

When the first conductive semiconductor layer 253 is grown, next, the active layer 254 is grown on the first conductive semiconductor layer 253, and then the second conductive semiconductor layer 255 is grown on the active layer 1154. As described above, when the first conductive semiconductor layer 253, the active layer 254 and the second conductive semiconductor layer 255 are sequentially grown, the first conductive semiconductor layer 253, the active layer 254, and the second conductive semiconductor layer 255 form a layer structure as illustrated in FIG. 5A.

In this case, the first conductive semiconductor layer 253 can be an n-type semiconductor layer, and the second conductive semiconductor layer 255 can be a p-type semiconductor layer. However, the present disclosure is not limited thereto, and the first conductive type can be p-type and the second conductive type can be n-type.

In addition, the present embodiment illustrates a case where the active layer is present, but it is also possible to adopt a structure in which the active layer is not present as described above. For such an example, the p-type semiconductor layer can be p-type GaN doped with Mg, and an n-electrode side in the n-type semiconductor layer can be n-type GaN doped with Si.

The growth substrate 259 (wafer) can be formed of any one of materials having light transmission properties, for example, sapphire ($Al_2O_3$), GaN, ZnO, and AlO, but is not limited thereto. Furthermore, the growth substrate 259 can be formed of a carrier wafer, which is a material suitable for semiconductor material growth. The growth substrate (W) can be formed of a material having an excellent thermal conductivity, and for example, a SiC substrate having a higher thermal conductivity than a sapphire ($Al_2O_3$) substrate or a SiC substrate including at least one of Si, GaAs, GaP, InP and $Ga_2O_3$ can be used.

In this specification, a display device using a passive matrix (PM) semiconductor light emitting device is illustrated.

More specifically, isolation and mesa are carried out so that a plurality of light emitting elements form an array. In other words, the first conductive semiconductor layer 253, the active layer 254, and the second conductive semiconductor layer 255 are etched in a vertical direction to form a plurality of semiconductor light emitting devices.

In order to from the horizontal semiconductor light emitting device at this stage, the active layer 254 and the second conductive semiconductor layer 255 can be partially removed in a vertical direction to perform a mesa process in which the first conductive semiconductor layer 253 is exposed to the outside, and then isolation in which the first conductive semiconductor layer is etched to form a plurality of semiconductor light emitting device arrays. In this case, the semiconductor light emitting device can be isolated to a circular size of 100 μm or less in diameter.

Next, a first conductive electrode 252 (or n-type electrode) is formed on one surface of the first conductive semiconductor layer 253, and a second conductive semiconductor layer 255 (or p-type electrode) is formed on one surface of the second conductive semiconductor layer 255.

The conductive electrodes can be formed by a deposition process such as sputtering, but the present disclosure is not necessarily limited thereto. However, when the first conductive semiconductor layer and the second conductive semiconductor layer are an n-type semiconductor layer and a p-type semiconductor layer, respectively, the second conductive electrode 256 can also be an n-type electrode.

At this time, at least one of the first conductive electrode 252 and the second conductive electrode 256 can have a magnetic body 257. The magnetic body 257 can refer to a metal having a magnetic property formed on a chip. The magnetic body can be Ni, Sn, Fe, Co or the like, and for another example, a material corresponding to at least one of Gd-based, La-based, and Mn-based materials.

Figure 5D:
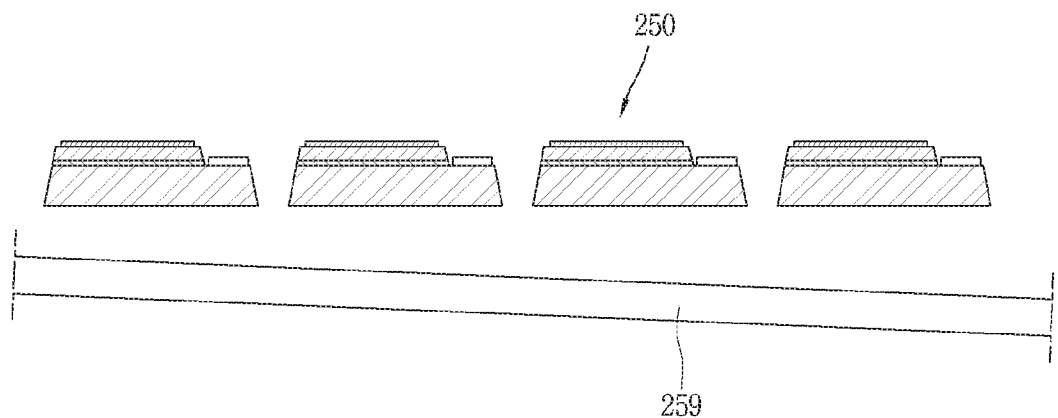

Then, the growth substrate 259 is removed to provide a plurality of semiconductor light emitting devices 250. For example, the growth substrate 259 can be removed using a laser lift-off (LLO) or chemical lift-off (CLO) method (FIG. 5D).

Figure 5E:
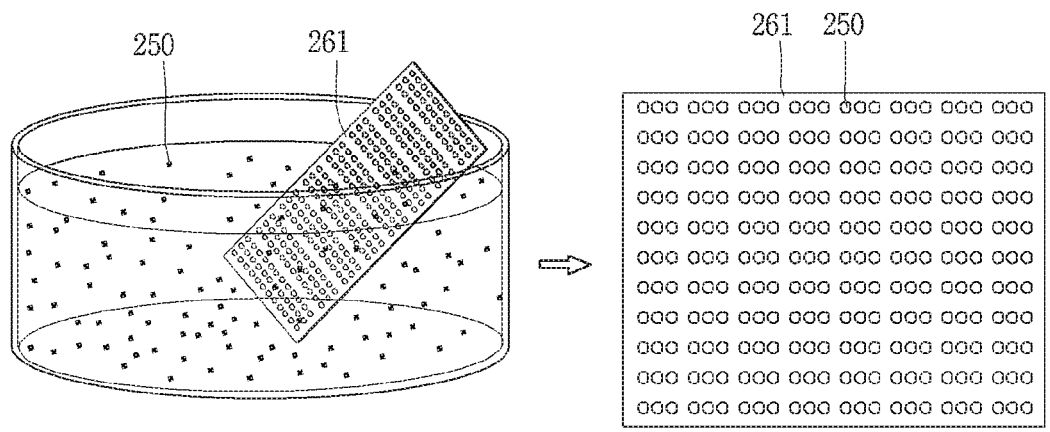

Then, the process of mounting the plurality of semiconductor light emitting devices 250 on the substrate in a chamber filled with a fluid (FIG. 5E).

For example, the semiconductor light emitting devices 250 and the substrate are placed in a chamber filled with a fluid, and the semiconductor light emitting devices 250 are assembled to the substrate by themselves using flow, gravity, surface tension, or the like.

In the present disclosure, the substrate can be a wiring substrate 261. In other words, the wiring substrate 261 is placed in the fluid chamber so that the semiconductor light emitting devices 250 are directly mounted on the wiring substrate 261.

Meanwhile, the self-assembly method described above must increase transfer yield when applied to the fabrication of a large-screen display. The present disclosure proposes a method and device for increasing transfer yield.

In this case, in a display device according to the present disclosure, a magnetic force is applied to the magnetic body in the semiconductor light emitting device to move the semiconductor light emitting device, and places the semiconductor light emitting device at preset positions using an electric field in the movement process. Hereinafter, such a transfer method and device will be described in more detail with reference to the accompanying drawings.

Figure 6:
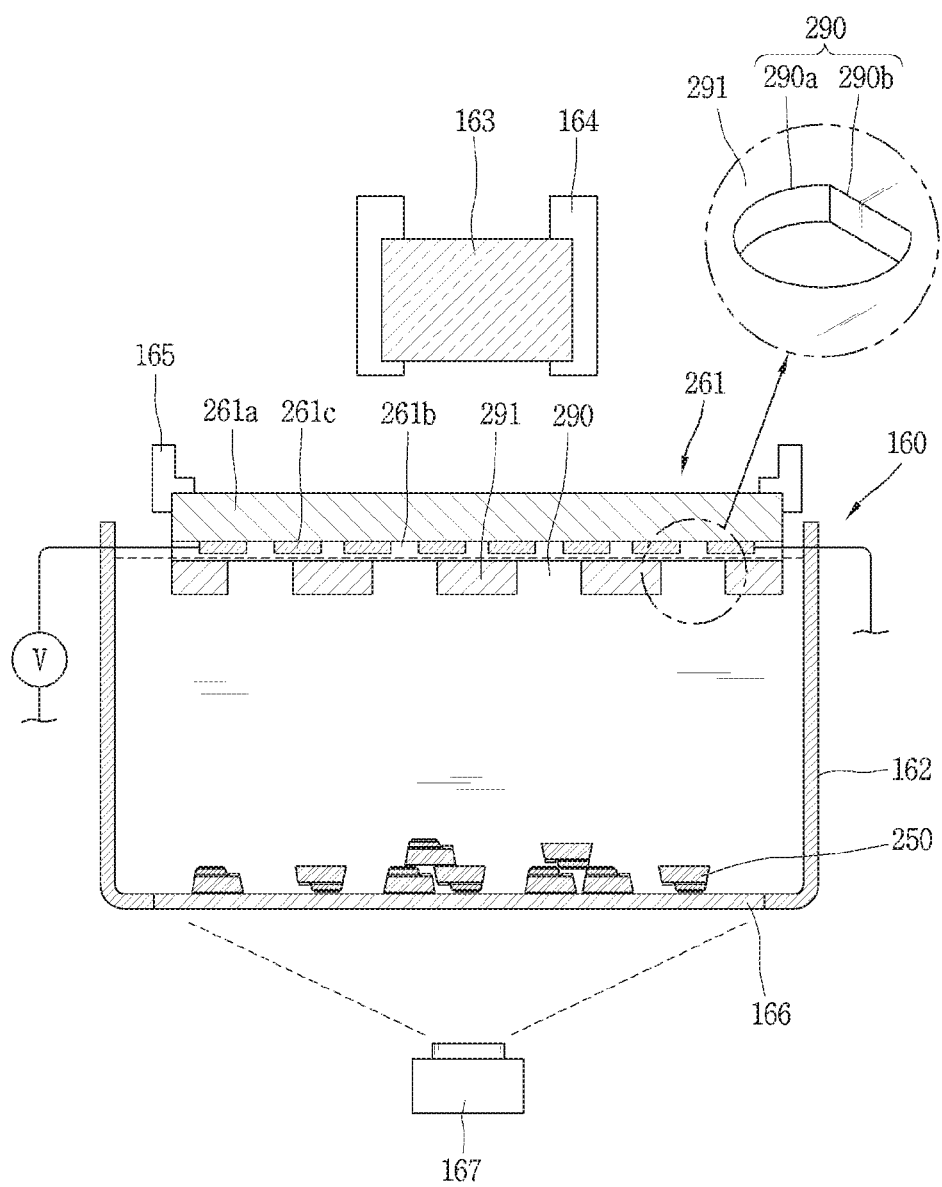
FIG. 6 is a view showing an example of a self-assembly device of semiconductor light emitting devices according to the present disclosure.
Figure 7:
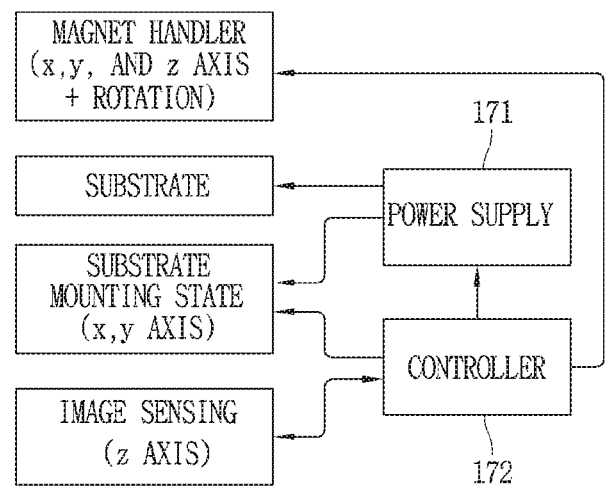
FIG. 7 is a block diagram showing the self-assembly device in FIG. 6.

FIG. 6 is a view showing an example of a self-assembly device of semiconductor light emitting devices according to the present invention, and FIG. 7 is a block diagram showing the self-assembly device in FIG. 6. Furthermore, FIGS. 8A through 8G are views showing a process of self-assembling semiconductor light emitting devices using the self-assembly device in FIG. 6.

According to the illustration of FIGS. 6 and 7, a self-assembly device 160 of the present disclosure can include a fluid chamber 162, a magnet 163, and a location controller 164.

The fluid chamber 162 has a space for accommodating a plurality of semiconductor light emitting devices. The space can be filled with a fluid, and the fluid can include water or the like as an assembly solution. Accordingly, the fluid chamber 162 can be a water tank, and can be configured with an open type. However, the present disclosure is not limited thereto, and the fluid chamber 162 can be a closed type in which the space is formed with a closed space.

The substrate 261 can be disposed on the fluid chamber 162 such that an assembly surface on which the semiconductor light emitting devices 250 are assembled faces downward. For example, the substrate 261 can be transferred to an assembly position by a transfer unit, and the transfer unit can include a stage 165 on which the substrate is mounted. The stage 165 is positioned by the controller, and the substrate 261 can be transferred to the assembly position through the stage 165.

At this time, the assembly surface of the substrate 261 faces the bottom of the fluid chamber 162 at the assembly position. According to the illustration, the assembly surface of the substrate 261 is disposed so as to be immersed in a fluid in the fluid chamber 162. Therefore, the semiconductor light emitting devices 250 are moved to the assembly surface in the fluid.

The substrate 261, which is an assembly substrate on which an electric field can be formed as well as a wiring substrate on which wiring lines are formed afterward, can include a base portion 261a, a dielectric layer 261b and a plurality of electrodes 261c, 261d.

The base portion 261a can be made of an insulating material, and the plurality of electrodes 261c can be a thin or a thick film bi-planar electrode patterned on one side of the base portion 261a. The electrode 261c can be formed of, for example, a laminate of Ti/Cu/Ti, an Ag paste, ITO, and the like.

More specifically, the electrode 261c can be a plurality of pair electrodes disposed on the substrate and provided with a first electrode and a second electrode that generate an electric field when an electric current is supplied.

The dielectric layer 261b is made of an inorganic material such as $SiO_2$, SiNx, SiON, $Al_2O_3$, $TiO_2$, $HfO_2$, or the like. Alternatively, the dielectric layer 261b can be composed of a single layer or multiple layers as an organic insulator. A thickness of the dielectric layer 261b can be several tens of nanometers to several micrometers.

Furthermore, the wiring substrate 261 according to the present disclosure includes a plurality of receiving grooves 290 partitioned by partition walls.

For example, the wiring substrate 261 can be provided with receiving grooves 290 into which the semiconductor light emitting devices 250 are inserted so that the semiconductor light emitting devices 250 can easily be mounted on the wiring substrate 261. Specifically, receiving grooves 290 on which the semiconductor light emitting devices 250 are mounted are formed on the wiring substrate 261 at positions where the semiconductor light emitting devices 250 are aligned with the wiring electrodes that supply current to the semiconductor light emitting devices 250. The semiconductor light emitting devices 250 are assembled into the receiving grooves 290 while moving in the fluid.

The receiving grooves 290 can be sequentially arranged along one direction to constitute a cell. An inside of the receiving groove 290 can be a space defined by the partition wall 291. The shape of the groove can be the same as or similar to that of the semiconductor light emitting device. In other words, the receiving groove 290 can have an asymmetric shape to match the asymmetrical shape of the semiconductor light emitting device, as described above. Therefore, the receiving groove of the wiring substrate can include a circular portion 290a and a straight portion 290b, and both ends of the circular portion 290a are connected by the straight portion 290b.

The partition wall 291 constituting the receiving groove 290 is made to be shared with neighboring cells. In this case, the partition wall 291 can be made of a polymer material. Furthermore, the partition wall 291 can be protruded from the base portion 261a, and the receiving grooves 290 can be sequentially arranged along the one direction by the partition wall 291. More specifically, the receiving grooves 290 are sequentially arranged in row and column directions, and can have a matrix structure.

On the other hand, according to the present disclosure, a material same as that of the partition wall 291 can be filled inside the receiving groove 290 by a subsequent process. Accordingly, the partition wall 291 can be modified into a passivation layer surrounding the semiconductor light emitting devices. This will be described later.

On the other hand, a plurality of electrodes can be disposed on the substrate, and have a first electrode and a second electrode that generate an electric field when an electric current is supplied, and the first electrode and the second electrode can be referred to as a pair electrode 261c. In the present disclosure, a plurality of the pair electrodes 261c can be provided, and disposed at the bottom of each of the receiving grooves. The first electrode and the second electrode can be formed of electrode lines, and the plurality of electrode lines can be extended to neighboring cells.

The pair electrodes 261c are disposed below the receiving groove 290 and applied with different polarities to generate an electric field in the receiving groove 290. In order to form the electric field, the dielectric layer can cover the pair electrodes 261c, and the dielectric layer can form the bottom of the receiving groove 290. In such a structure, when different polarities are applied to the pair electrode 261c from a lower side of each receiving groove 290, an electric field can be formed, and the semiconductor light emitting device can be inserted into the receiving groove 290 by the electric field.

At the assembly position, the electrodes of the substrate 261 are electrically connected to the power supply unit 171. The power supply unit 171 applies power to the plurality of electrodes to generate the electric field.

According to the illustration, the self-assembly device can include a magnet 163 for applying a magnetic force to the semiconductor light emitting devices. The magnet 163 is spaced apart from the fluid chamber 162 to apply a magnetic force to the semiconductor light emitting devices 250. The magnet 163 can be disposed to face an opposite side of the assembly surface of the substrate 261, and the location of the magnet is controlled by the location controller 164 connected to the magnet 163. The semiconductor light emitting device 250 can have a magnetic body so as to move in the fluid by the magnetic field of the magnet 163.

Referring to FIGS. 6 and 7, more specifically, the self-assembly device can include a magnet handler that can be automatically or manually moved in the x, y, and z axes on the top of the fluid chamber or include a motor capable of rotating the magnet 163. The magnet handler and the motor can constitute the location controller 164. Through this, the magnet 163 rotates in a horizontal direction, a clockwise direction, or a counterclockwise direction with respect to the substrate 261.

On the other hand, a light transmitting bottom plate 166 can be formed in the fluid chamber 162, and the semiconductor light emitting devices can be disposed between the bottom plate 166 and the substrate 161. An image sensor 167 can be positioned to view the bottom plate 166 so as to monitor an inside of the fluid chamber 162 through the bottom plate 166. The image sensor 167 is controlled by the controller 172, and can include an inverted type lens, a CCD, and the like to observe the assembly surface of the substrate 261.

The self-assembling apparatus described above is configured to use a combination of a magnetic field and an electric field, and using those fields, the semiconductor light emitting devices can be placed at preset positions of the substrate by an electric field in the process of being moved by a location change of the magnet. Such a new fabrication method can be a detailed example of the self-assembly method described above with reference to FIG. 5E. Hereinafter, an assembly process using the self-assembly device described above will be described in more detail.

First, a plurality of semiconductor light emitting devices 250 having magnetic bodies are formed through the process described with reference to FIGS. 5A through 5D. In this case, a magnetic body can be deposited on the semiconductor light emitting device in the process of forming the second conductive electrode in FIG. 5C.

Figure 8A:
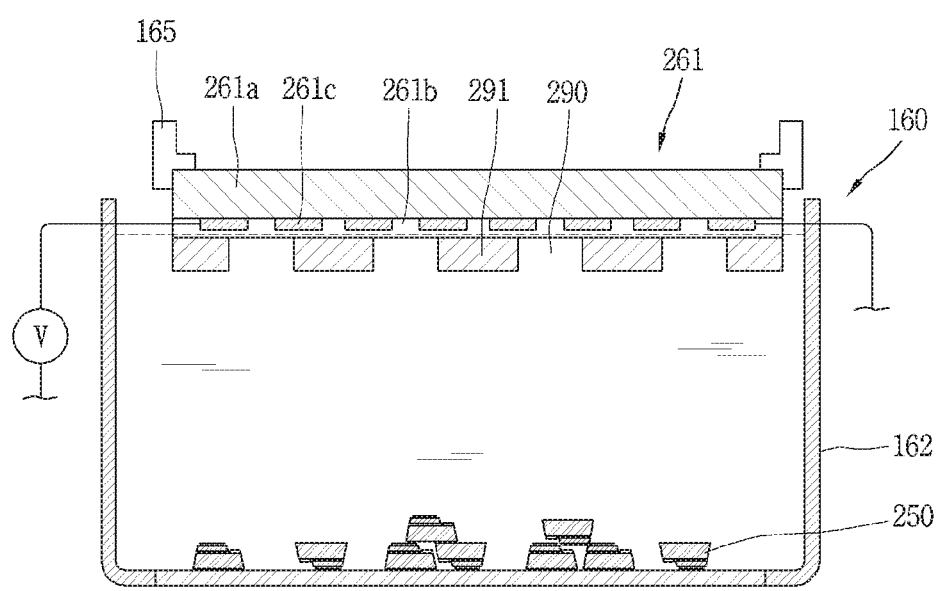
FIGS. 8A through 8G are views showing a process of self-assembling semiconductor light emitting devices using the self-assembly device in FIG. 6.

Next, the substrate 261 is transferred to the assembly position, and the semiconductor light emitting devices 250 are put into the fluid chamber 162 (FIG. 8A).

As described above, the assembly position of the substrate 261 is a position at which the assembly surface on which the semiconductor light emitting devices 250 of the substrate 261 are assembled is disposed in a downward direction in the fluid chamber 162.

In this case, some of the semiconductor light emitting devices 250 can sink to the bottom of the fluid chamber 162 and some can float in the fluid. When the light transmitting bottom plate 166 is provided in the fluid chamber 162, some of the semiconductor light-emitting devices 250 can sink to the bottom plate 166.

Figure 8B:
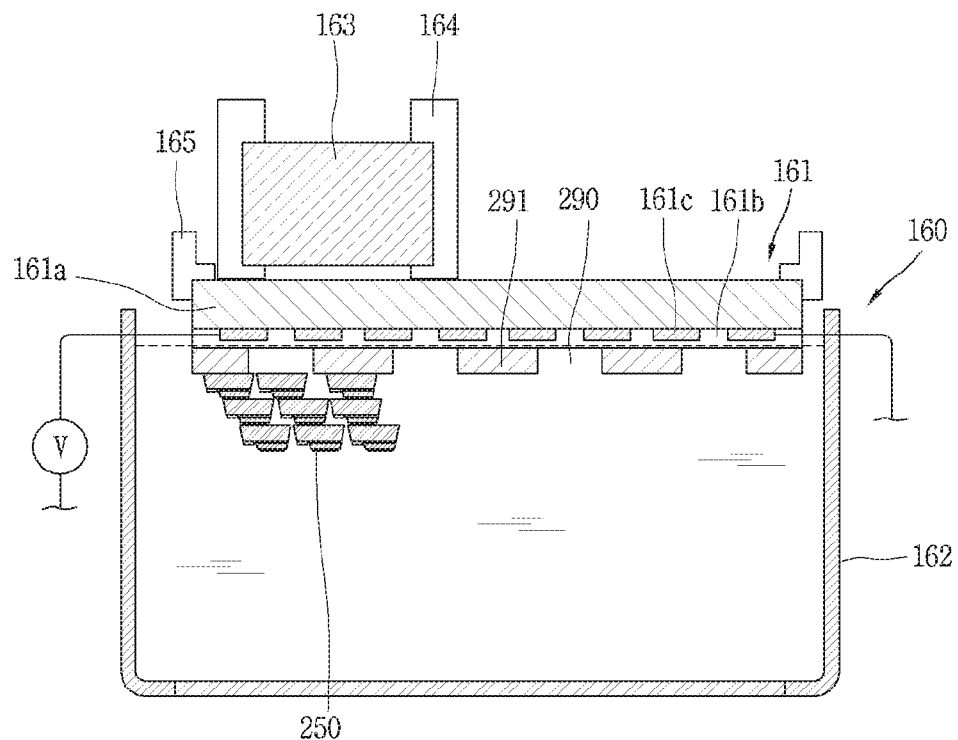

Next, a magnetic force is applied to the semiconductor light emitting devices 250 so that the semiconductor light emitting devices 250 float in the fluid chamber 162 in a vertical direction (FIG. 8B).

When the magnet 163 of the self-assembly device moves from its original position to an opposite side of the assembly surface of the substrate 261, the semiconductor light emitting devices 250 float in the fluid toward the substrate 261. The original position can be a position away from the fluid chamber 162. For another example, the magnet 163 can be composed of an electromagnet. In this case, electricity is supplied to the electromagnet to generate an initial magnetic force.

Meanwhile, in this example, a separation distance between the assembly surface of the substrate 261 and the semiconductor light emitting devices 250 can be controlled by adjusting the magnitude of the magnetic force. For example, the separation distance is controlled using the weight, buoyancy, and magnetic force of the semiconductor light emitting devices 250. The separation distance can be several millimeters to tens of micrometers from the outermost edge of the substrate.

Figure 8C:
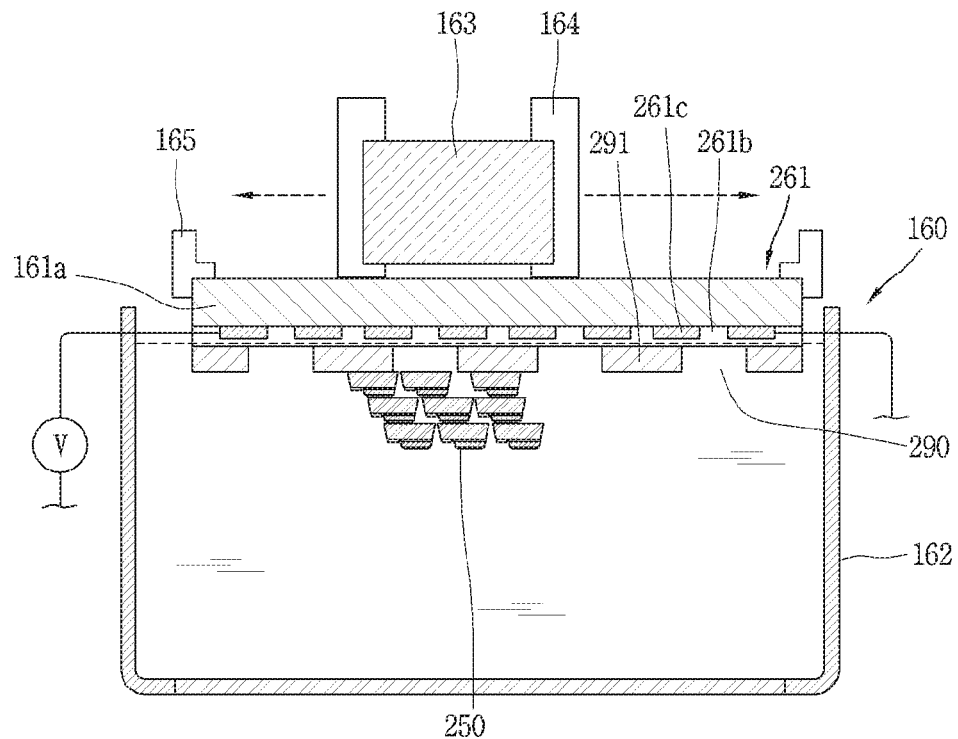

Next, a magnetic force is applied to the semiconductor light emitting devices 250 so that the semiconductor light emitting devices 250 move in one direction in the fluid chamber 162. For example, the magnet 163 moves in a horizontal direction, a clockwise direction or a counterclockwise direction with respect to the substrate (FIG. 8C). In this case, the semiconductor light emitting devices 250 move in a direction parallel to the substrate 261 at a position spaced apart from the substrate 261 by the magnetic force.

Figure 8D:
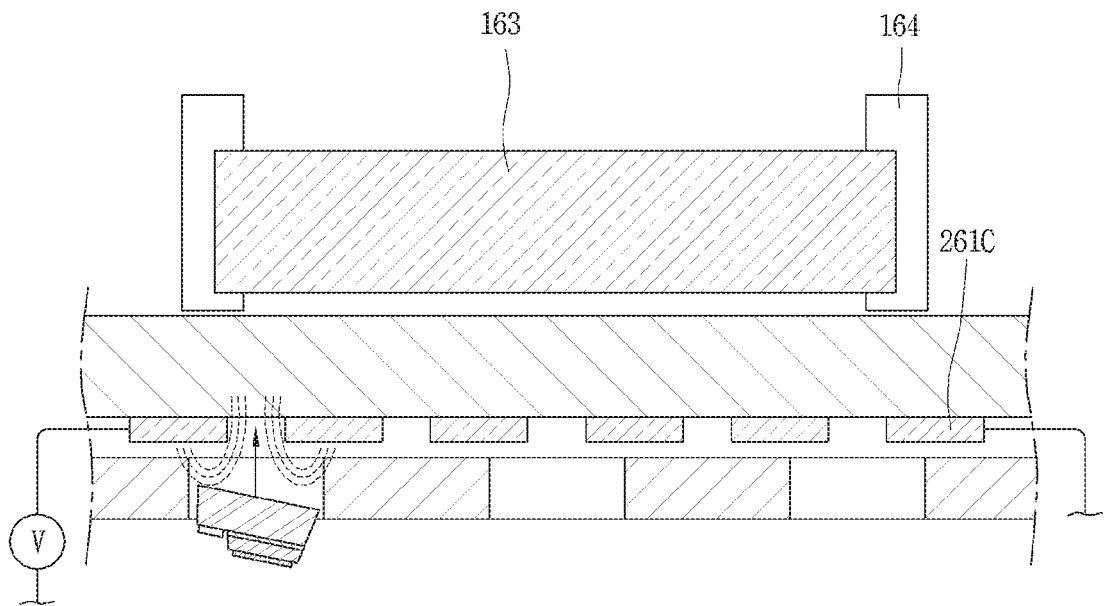

Next, the process of applying an electric field to guide the semiconductor light emitting devices 250 to preset positions of the substrate 261 so as to allow the semiconductor light emitting devices 250 to be placed at the preset positions during the movement of the semiconductor light emitting devices 250 is carried out (FIG. 8D). The semiconductor light emitting devices 250 move in a direction perpendicular to the substrate 261 by the electric field to be placed on preset positions while moving along a direction parallel to the substrate 261.

The plurality of semiconductor light emitting devices are guided to preset positions of the substrate by an electric field and a magnetic field.

More specifically, electric power is supplied to a pair electrode, that is, a bi-planar electrode of the substrate 261 to generate an electric field, and assembly is carried out only at preset positions. In other words, the semiconductor light emitting devices 250 are assembled to the assembly position of the substrate 261 using a selectively generated electric field. For this purpose, the substrate 261 can include cells in which the semiconductor light emitting devices 250 are inserted.

At this time, the magnetic body 257 of the semiconductor light emitting devices 250 serves as a post for upper and lower division. Specifically, when a surface having the magnetic body 257 is inserted into the cell in a direction toward the pair electrode 261c, the semiconductor light emitting device is unable to be placed on the bottom of the cell (an outer surface of the dielectric layer) by the magnetic body 257.

Figure 8E:
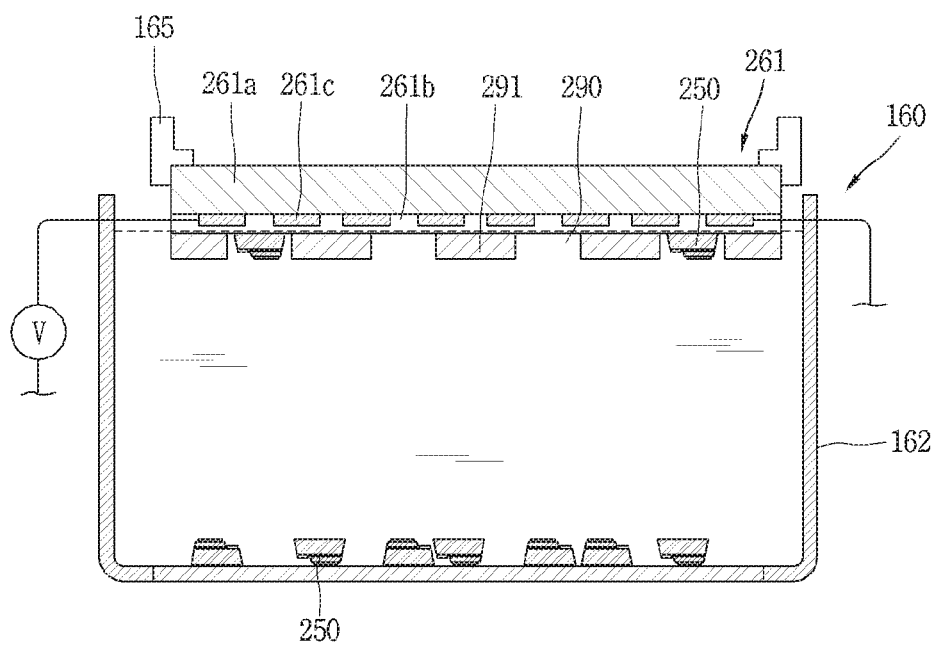

On the other hand, the semiconductor light emitting devices 250 can be guided to the preset positions, then the magnet 163 can move in a direction away from the substrate 261 such that the semiconductor light emitting devices 250 remaining in the fluid chambers 162 fall to the bottom of the fluid chambers 162, (FIG. 8E). For another example, if power supply is stopped when the magnet 163 is an electromagnet, then the semiconductor light emitting devices 250 remaining in the fluid chamber 162 fall to the bottom of the fluid chamber 162.

Then, when the semiconductor light emitting devices 250 on the bottom of the fluid chamber 162 are collected, the collected semiconductor light emitting devices 250 can be reused.

When the display device of the present disclosure uses blue semiconductor light emitting devices, that is, when the semiconductor light emitting devices are all blue semiconductor light emitting devices, the blue semiconductor light emitting devices can be assembled into all the cells of the substrate.

On the other hand, according to this example, each of the red semiconductor light emitting device, the green semiconductor light emitting device, and the blue semiconductor light emitting device can be arranged at a desired position. If the foregoing semiconductor light emitting device 250 is a blue semiconductor light emitting device, the assembly process described with reference to FIGS. 8A through 8E can generate an electric field only in a cell corresponding to a blue pixel to assemble the blue semiconductor light emitting device at a corresponding position.

Figure 8F:
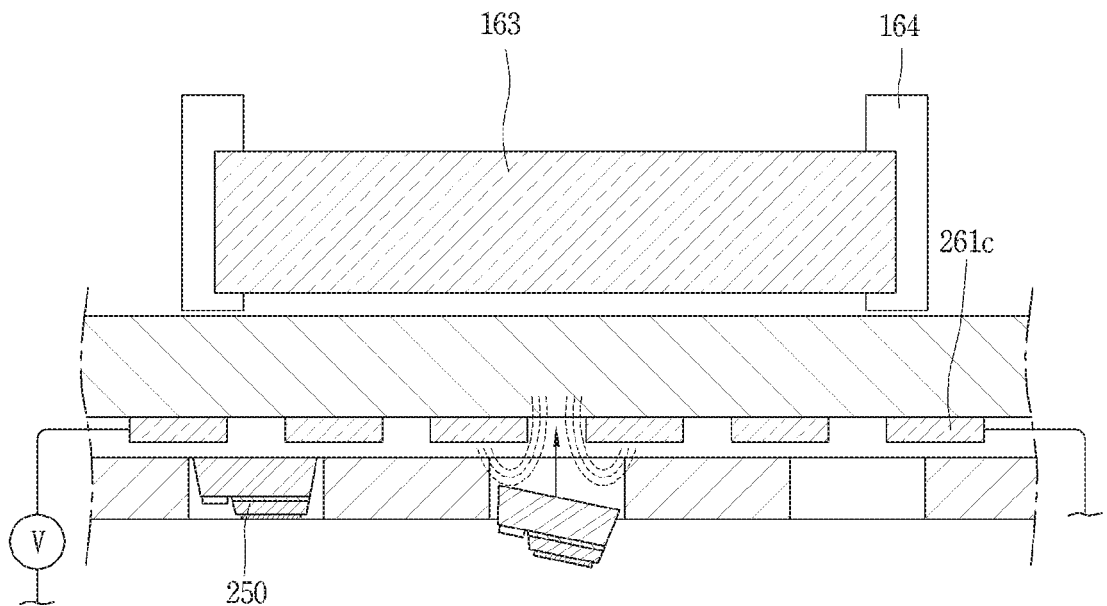
Figure 8G:
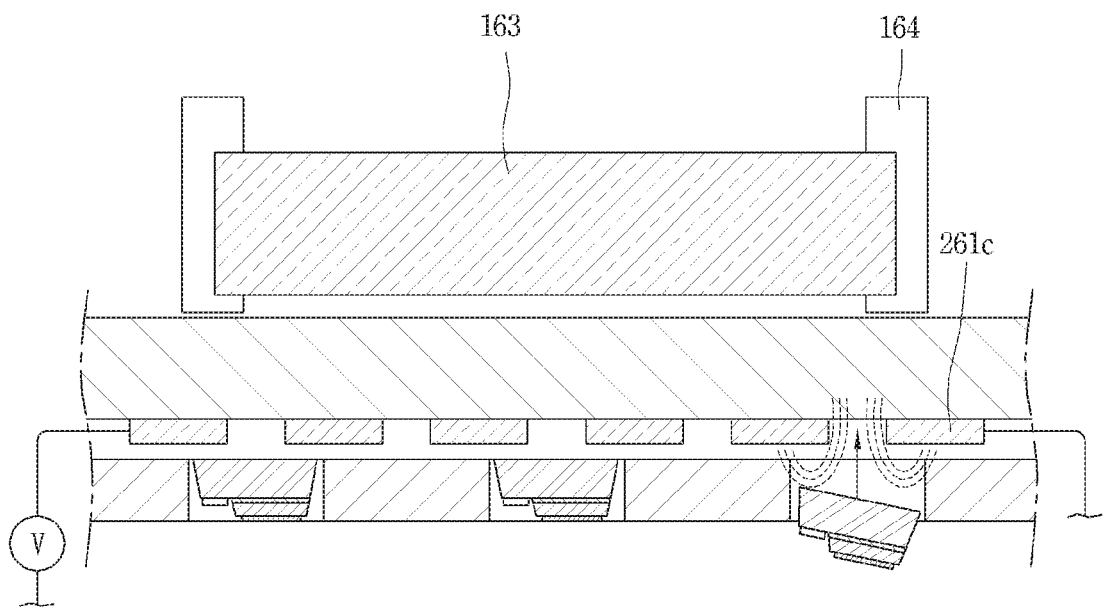

Then, the assembly process described with reference to 8A through 8E are carried out using the green semiconductor light emitting device 250a and the red semiconductor light emitting device 250b, respectively (FIGS. 8F and 8G). However, since the wiring substrate 261 is already loaded at the assembly position, the process of loading the substrate into the assembly position can be omitted.

Then, the process of unloading the wiring substrate 261 is carried out, and the assembly process is completed.

The above-described self-assembly device and method are characterized in that, in order to increase the assembly yield in a fluidic assembly, parts at a far distance are concentrated adjacent to a preset assembly site using a magnetic field, and a separate electric field is applied to the assembly site to selectively assemble the parts only in the assembly site. At this time, the assembly substrate is placed on an upper portion of the water tank and the assembly surface faces downward, thereby preventing nonspecific coupling while minimizing the effect of gravity due to the weight of parts. In other words, in order to increase the transfer yield, the assembly substrate is placed on the top to minimize the effect of a gravitational or frictional force, and prevent nonspecific coupling.

Furthermore, the blue semiconductor light emitting device, the green semiconductor light emitting device, and the red semiconductor light emitting device can be assembled at desired positions, respectively.

As described above, according to the present disclosure having the foregoing configuration, a large number of semiconductor light emitting devices can be assembled at one time in a display device in which individual pixels are formed with semiconductor light emitting devices.

When the assembly process is completed as described above, a process of fabricating a display device can be carried out. Hereinafter, a fabrication process of such a display device will be described in detail with reference to the drawings.

FIGS. 9A through 9E are views showing a process of fabricating a display device after self-assembling semiconductor light emitting devices on a wiring substrate using the self-assembly device in FIG. 6.

Figure 9A:
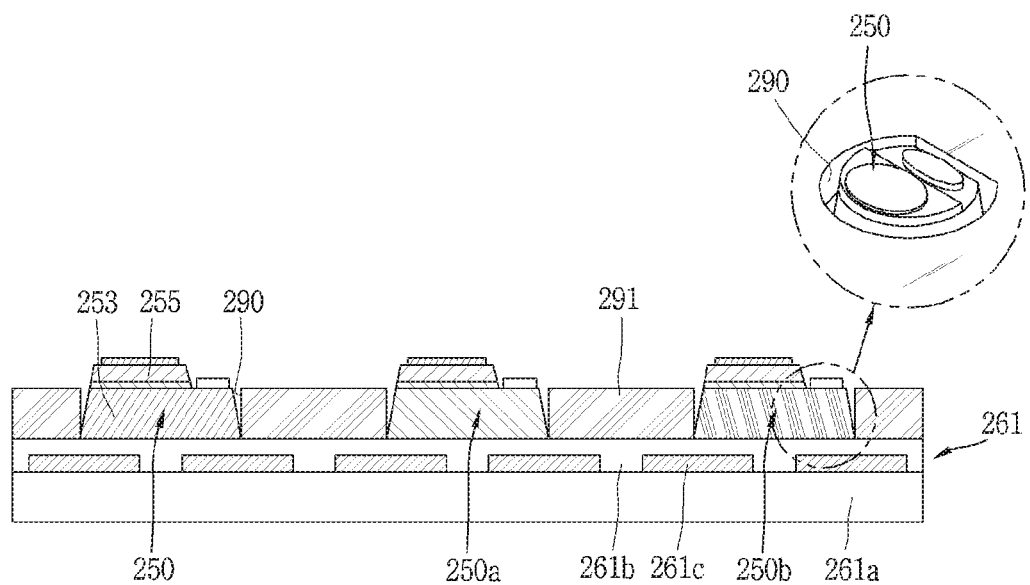
FIGS. 9A through 9D are views showing a process of fabricating a display device after self-assembling semiconductor light emitting devices on a wiring substrate using the self-assembly device in FIG. 6.
Figure 9B:
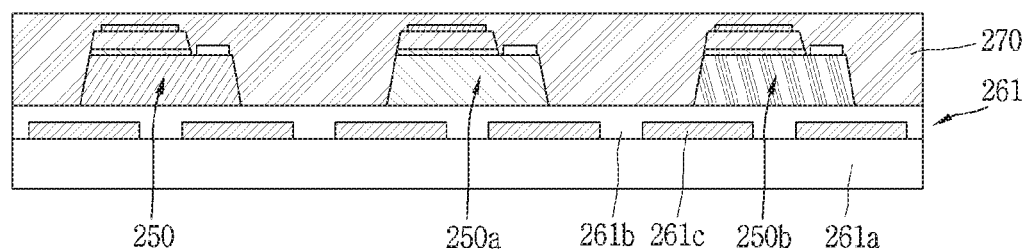
Figure 9C:
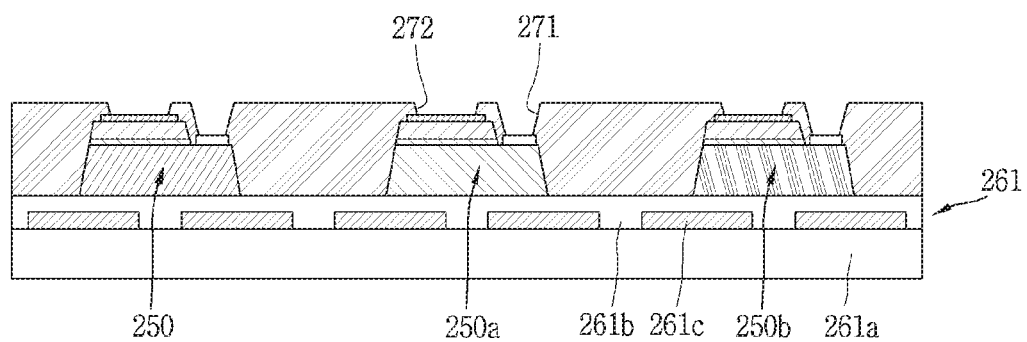

The movement of the semiconductor light emitting devices in the fluid chamber are guided, and the semiconductor light emitting devices are assembled at preset positions of the substrate by the foregoing process, and then a passivation layer 270 is filled between the plurality of semiconductor light emitting devices while the semiconductor light emitting devices 250, 250a, 250b are assembled at the preset positions of the substrate 261 (FIGS. 9A and 9B).

More specifically, as described above, the wiring substrate 261 includes a plurality of receiving grooves 290 partitioned by partition walls, and a gap exists between the receiving groove 290 and the semiconductor light emitting device. The passivation layer 270 fills the gap while covering the semiconductor light emitting device together with the partition walls.

Through such a process, a structure in which the passivation layer 270 surrounds the semiconductor light emitting device can be formed on the display. In this case, the passivation layer 270 can be made of a polymer material so as to be integrated with the partition walls.

Figure 9D:
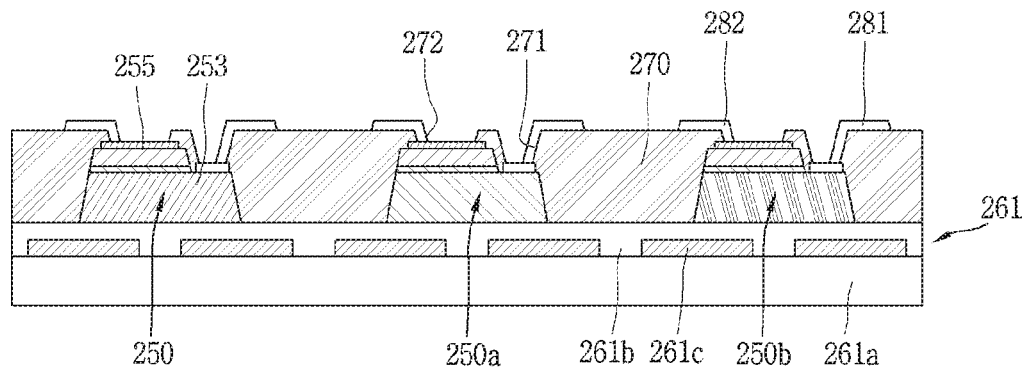

In the display device shown in FIG. 9D implemented by the above process, the passivation layer 270 can include a plurality of receiving grooves, and the plurality of semiconductor light emitting devices can be accommodated in the receiving grooves. In other words, the receiving grooves that have been provided in the self-assembly process in the final structure are changed into the internal spaces of the passivation layer 270.

Therefore, the receiving groove is formed in the passivation layer, and has an asymmetrical shape with respect to one direction so as to match the shape of the first conductive semiconductor layer. Here, the one direction can be a direction parallel to the straight portion of the receiving groove, and along a central axis passing through the center of the circular portion.

In this case, an electric field generated by the pair electrodes 261c described with reference to FIG. 9D as described above can be formed inside the cells. In addition, the plurality of cells are arranged in a matrix structure, and the plurality of the pair electrodes 261c have a structure extended to neighboring cells.

Next, thereafter, a planarization process is carried out to planarize a top surface of the passivation layer 270, and contact holes 271, 272 for wiring lines can be formed.

The contact holes 271, 272 can be formed in the first conductive semiconductor layer 253 and the second conductive semiconductor layer 255, respectively.

Finally, the first wiring electrodes and the second wiring electrodes are connected to the plurality of semiconductor light emitting devices through the contact holes (FIG. 9D).

According to the illustration of FIG. 9D, the first wiring electrode 281 and the second wiring electrode 282 can be extended to one surface of the passivation layer 270. At this time, one surface of the passivation layer 270 can be a surface opposite to a surface covering the dielectric layer 261b. For example, the first wiring electrode 281 is extended to an upper surface of the passivation layer 270 on the first conductive semiconductor layer 253 through a first contact hole 271 formed on the first conductive semiconductor layer 253. The second wiring electrode 282 is extended to an upper surface of the passivation layer 270 through a second contact hole 272 formed on the second conductive semiconductor layer 255. However, for another example, when the second conductive electrode 256 (see FIG. 5D) is present on an upper surface of the second conductive semiconductor layer 255, the second wiring electrode 282 can be extended to an upper surface of the passivation layer 270 through the second contact hole 272.

According to such a structure, although transfer is carried out by self-assembly, the wiring lines of the flip-chip type semiconductor light emitting devices can be implemented. In this case, the passivation layer 270 can be disposed on a front side of the display device 100 (see FIG. 1), and at this time, the first wiring electrode 281 and the second wiring electrode 282 can be transparent electrodes. At this time, the pair electrode 261c made of a metal material can be used as a reflective layer.

For another example, the passivation layer 270 can be disposed on a rear side of the display device 100, and at this time, the dielectric layer 261b and the base portion 261a of the substrate 261 are formed of a transparent material.

Meanwhile, the semiconductor light emitting device applied to the process and device of the present disclosure described above can be modified into various forms. Hereinafter, these modified examples will be described with reference to FIGS. 10A through 10D. FIGS. 10A through 10D are plan views showing a modified example of the semiconductor light emitting device of the present disclosure.

Figure 10A:
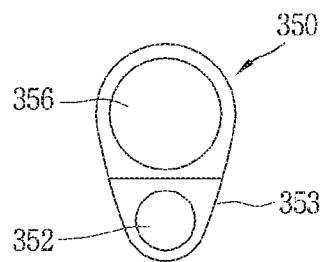
FIGS. 10A through 10D are plan views showing a modified example of the semiconductor light emitting device of the present disclosure.

Referring to FIG. 10A, the center of the cross section of the first conductive semiconductor layer of the semiconductor light emitting device can be eccentrically centered on one side.

More specifically, in the semiconductor light emitting device 350, a p-type electrode 356 and an n-type electrode 352 can be spaced apart in a horizontal direction, and an n-type semiconductor layer 353 can be an egg shape which is asymmetrical with respect to one direction but symmetrical with respect to the other direction. More specifically, the shape of the n-type semiconductor layer 353 can be a conical shape with a larger length on one side thereof. In this case, the p-type electrode 356 and the n-type electrode 352 are each formed in a circular shape, and arranged in a row along the other direction. According to such a structure, the center of the cross section of the n-type semiconductor layer 353 is eccentrically formed on one side along the other direction.

Figure 10B:
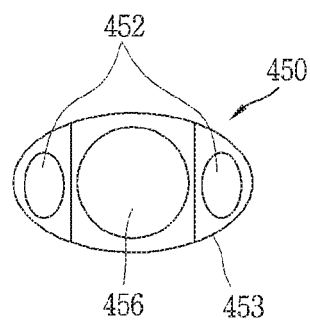

For another example, referring to FIG. 10B, the semiconductor light emitting device 450 can be a symmetric structure in which an n-type semiconductor layer 453 has an elliptical shape and n-type electrodes 452 are disposed on both sides of the p-type electrode 456 therebetween.

Figure 10C:
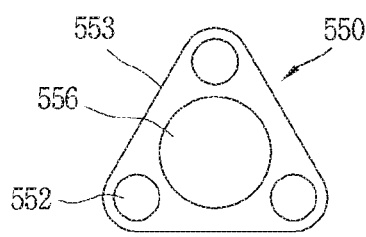
Figure 10D:
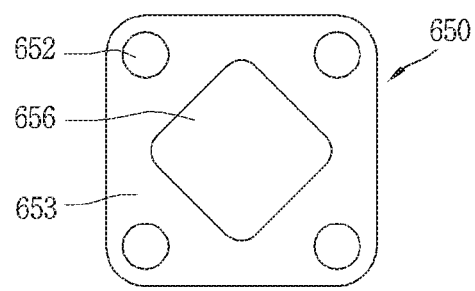

For another example, referring to FIGS. 10C and 10D, the semiconductor light emitting device 550, 650 can be formed to have an n-type semiconductor layer 553, 653 having a polygonal shape, and have symmetrical axes equal to or less than the number of vertexes or sides thereof. In this case, n-type electrodes 552, 652 can be disposed adjacent to the respective vertexes, and the p-type electrode 556, 656 can be disposed at the center of the polygon.

The shape of the receiving groove of the wiring substrate can be set so as to match the shape of the semiconductor light emitting device described above, particularly, the shape of the n-type semiconductor layer. According to such a structure of the semiconductor light emitting device, when the semiconductor light emitting device is assembled into the receiving groove, a relative position between the n-type electrode and the p-type electrode can be always constant. In FIGS. 10A-10D, and other embodiments, the number of the first conductive electrode (e.g., 552) on the first conductive semiconductor layer (e.g., 553) can be equal to or greater than the number of the second conductive electrode (e.g., 556) on the second conductive semiconductor layer (e.g., FIG. 10C for example). Also, in embodiments, the plurality of first conductive electrodes can be formed at corners of the semiconductor light emitting device (FIGS. 10B-10D). Additionally, in embodiments, a shape of the first conductive electrode can be different from a shape of the second conductive electrode (FIGS. 10C-10D).

According to the process and device of the present disclosure described above, a large number of semiconductor light emitting devices can be pixelated on a wafer having a small size, and then directly transferred onto a large-area substrate. Through this, it can be possible to fabricate a large-area display device at a low cost.

What is claimed is:

1. A display device, comprising:
a semiconductor light emitting device; and
a substrate having a receiving groove in which the semiconductor light emitting device is accommodated;
wherein the semiconductor light emitting device comprises:
a first conductive semiconductor layer;
a second conductive semiconductor layer disposed on an upper portion of the first conductive semiconductor layer;
a first conductive electrode disposed on the first conductive semiconductor layer; and
a second conductive electrode disposed on the second conductive semiconductor layer, and spaced apart from the first conductive electrode along a horizontal direction of the semiconductor light emitting device,
wherein the first conductive semiconductor layer has a symmetrical shape with respect to at least one direction of the semiconductor light emitting device so that the first conductive electrode and the second conductive electrode are arranged at preset positions when the semiconductor light emitting device is accommodated into the receiving groove, and
wherein a shape of the receiving groove matches the symmetrical shape of the first conductive semiconductor layer to control an assembly direction of the semiconductor light emitting device.

2. The display device of claim 1, wherein the first conductive semiconductor layer has a symmetrical shape with respect to another direction of the semiconductor light emitting device, the another direction being a direction that intersects the at least one direction.

3. The display device of claim 1, wherein the first conductive semiconductor layer has an elliptical shape.

4. The display device of claim 3, wherein the semiconductor light emitting device has a plurality of first conductive electrodes including the first conductive electrode, and
wherein the plurality of the first conductive electrodes are disposed on opposite sides of the second conductive electrode.

5. The display device of claim 4, wherein the plurality of the first conductive electrodes and the second conductive electrode are disposed along a long axis direction of the first conductive semiconductor layer having the elliptical shape.

6. The display device of claim 1, wherein a size of the second conductive electrode is greater than a size of the first conductive electrode.

7. The display device of claim 1, wherein the first conductive semiconductor layer is an n-type semiconductor layer and the first conductive electrode is an n-type electrode, and
wherein the second conductive semiconductor layer is a p-type semiconductor layer and the second conductive electrode is a p-type electrode.

8. The display device of claim 1, wherein the substrate further comprises a passivation layer to cover the semiconductor light emitting device,
wherein the receiving groove is formed in the passivation layer; and
wherein the receiving groove has a shape which matches the symmetrical shape of the first conductive semiconductor layer.

9. The display device of claim 8, wherein the substrate further comprises a first wiring electrode and a second wiring electrode to supply an electric current to the semiconductor light emitting device, and
wherein the first conductive electrode and the second conductive electrode are connected to the first wiring electrode and the second wiring electrode, respectively, and the first wiring electrode and the second wiring electrode are extended to one surface of the passivation layer.

10. The display device of claim 1, wherein the first conductive electrode and the second conductive electrode have different shapes.

11. The display device of claim 1, wherein the first conductive electrode has an elliptical shape, and the second conductive electrode has a circular shape.

12. The display device of claim 11, wherein the first conductive semiconductor layer has an elliptical shape, and
wherein a long axis direction of the first conductive electrode intersects a long axis direction of the first conductive semiconductor layer.

13. A display device, comprising:
a semiconductor light emitting device; and
a substrate having a receiving groove in which the semiconductor light emitting device is accommodated,
wherein the semiconductor light emitting device comprises:
a first conductive semiconductor layer;
a second conductive semiconductor layer disposed on an upper portion of the first conductive semiconductor layer;
a first conductive electrode disposed on the first conductive semiconductor layer; and
a second conductive electrode disposed on the second conductive semiconductor layer and spaced apart from the first conductive electrode along a horizontal direction of the semiconductor light emitting device,
wherein the first conductive semiconductor layer has an elliptical shape so that the first conductive electrode and the second conductive electrode are arranged at preset positions when the semiconductor light emitting device is accommodated into the receiving groove,
wherein a shape of the receiving groove matches the elliptical shape of the first conductive semiconductor layer to control an assembly direction of the semiconductor light emitting device.

14. The display device of claim 13, wherein the semiconductor light emitting device has a plurality of first conductive electrodes including the first conductive electrode, and
wherein the plurality of first conductive electrodes are disposed on opposite sides of the second conductive electrode.

15. The display device of claim 13, wherein a size of the second conductive electrode is greater than a size of the first conductive electrode.

16. The display device of claim 13, wherein a long axis direction of the first conductive electrode having an elliptical shape intersects a long axis direction of the first conductive semiconductor layer.

17. A fabrication method of a display device, the method comprising:
transferring a substrate to an assembly position, and placing a plurality of semiconductor light emitting devices into a fluid chamber, each semiconductor light emitting device having a first conductive semiconductor layer, a first conductive electrode on the first conductive semiconductor layer, a second conductive semiconductor layer, and a second conductive electrode on the second conductive semiconductor layer;
guiding a movement of the plurality of semiconductor light emitting devices in the fluid chamber to place the plurality of semiconductor light emitting devices respectively into a plurality of receiving grooves of the substrate; and connecting a first wiring electrode and a second wiring electrode to each semiconductor light emitting device for all of the plurality of semiconductor light emitting devices, wherein the plurality of semiconductor light emitting devices are assembled to the substrate which is placed such that the plurality of receiving grooves face to a bottom of the fluid chamber, and wherein the first conductive semiconductor layer has a symmetrical shape with respect to at least one direction and a shape of the plurality of receiving grooves matches the symmetrical shape of the first conductive semiconductor layer so that the first conductive electrode and the second conductive electrode are arranged at preset positions when the plurality of semiconductor light emitting devices are assembled into the plurality of receiving grooves in an assembly process.

18. The method of claim 17, wherein the first conductive semiconductor layer has a symmetrical shape with respect to another direction of the semiconductor light emitting device, the another direction being a direction that intersects the at least one direction.

19. The method of claim 17, wherein the assembly process of the plurality of semiconductor light emitting devices into the plurality of receiving grooves comprises:

applying a magnetic field to the plurality of semiconductor light emitting devices to move the plurality of semiconductor light emitting devices along a direction in the fluid chamber; and guiding the plurality of semiconductor light emitting devices to the plurality of receiving grooves of the substrate by applying an electric field so that the plurality of semiconductor light emitting devices are placed at the plurality of receiving grooves during the movement of the plurality of semiconductor light emitting devices.

20. The method of claim 17, wherein the first conductive semiconductor layer has an elliptical shape.

* * * * *